(12) United States Patent
Bo et al.

(10) Patent No.: US 11,152,068 B2
(45) Date of Patent: Oct. 19, 2021

(54) INTEGRATED CIRCUIT INCLUDING VERTICAL CAPACITORS

(71) Applicant: TEXAS INSTRUMENTS INCORPORATED, Dallas, TX (US)

(72) Inventors: Xiang-Zheng Bo, Plano, TX (US); Patrick R. Smith, Rockwall, TX (US); Douglas T. Grider, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 68 days.

(21) Appl. No.: 16/823,414

(22) Filed: Mar. 19, 2020

(65) Prior Publication Data

US 2020/0219566 A1 Jul. 9, 2020

Related U.S. Application Data

(62) Division of application No. 15/977,712, filed on May 11, 2018, now Pat. No. 10,622,073.

(51) Int. Cl.
*H01L 29/78* (2006.01)
*G11C 16/04* (2006.01)
*H01L 27/1156* (2017.01)
*H01L 27/108* (2006.01)
*H01L 27/118* (2006.01)

(52) U.S. Cl.
CPC .... *G11C 16/0441* (2013.01); *H01L 27/10829* (2013.01); *H01L 27/1156* (2013.01); *H01L 29/7846* (2013.01); *H01L 2027/11831* (2013.01)

(58) Field of Classification Search
CPC .................................................. H01L 23/5389
See application file for complete search history.

(56) References Cited

U.S. PATENT DOCUMENTS

| | | | |
|---|---|---|---|
| 6,083,790 A | 7/2000 | Lin et al. | |
| 6,479,341 B1 | 11/2002 | Lu | |
| 7,232,717 B1 | 6/2007 | Choi et al. | |
| 2003/0001208 A1 | 2/2003 | Forbes et al. | |
| 2003/0113967 A1 | 6/2003 | Allman et al. | |
| 2004/0173869 A1 | 9/2004 | Bez et al. | |
| 2007/0231970 A1* | 10/2007 | Fukuo | H01L 25/0657 438/127 |
| 2009/0095995 A1 | 4/2009 | Kawashima et al. | |
| 2013/0076335 A1 | 3/2013 | Lin et al. | |
| 2014/0091471 A1* | 4/2014 | Chen | H01L 25/18 257/770 |
| 2014/0220749 A1 | 8/2014 | Rutter | |

(Continued)

OTHER PUBLICATIONS

PCT Search Report for Application No. PCT/US 2019/031417, dated Aug. 22, 2019.

(Continued)

*Primary Examiner* — Thao P Le
(74) *Attorney, Agent, or Firm* — Andrew R. Ralston; Charles A. Brill; Frank D. Cimino

(57) ABSTRACT

In some examples, an integrated circuit comprises a first plate, a second plate, and a dielectric layer disposed between the first and second plates, the first and second plates and the dielectric layer forming a vertical capacitor, wherein the first and second plates and the dielectric layer of the vertical capacitor are disposed on an isolation region of the integrated circuit.

21 Claims, 12 Drawing Sheets

(56) References Cited

U.S. PATENT DOCUMENTS

| | | | |
|---|---|---|---|
| 2015/0091160 A1* | 4/2015 | Reber | H01L 25/0657 |
| | | | 257/737 |
| 2015/0091178 A1* | 4/2015 | Reber | H01L 23/481 |
| | | | 257/774 |
| 2016/0064402 A1 | 3/2016 | Umeda et al. | |
| 2016/0300781 A1* | 10/2016 | Xue | B81B 7/0048 |
| 2016/0322343 A1* | 11/2016 | Scanlan | H01L 21/565 |
| 2017/0025429 A1 | 1/2017 | Jen et al. | |
| 2017/0278825 A1* | 9/2017 | Lakhera | H01L 21/565 |
| 2019/0326259 A1* | 10/2019 | Yu | H01L 23/3114 |

OTHER PUBLICATIONS

Search Report for Application No. 19800869.0-1212 / 3791428 PCT/US201903417, dated May 14, 2021.

* cited by examiner

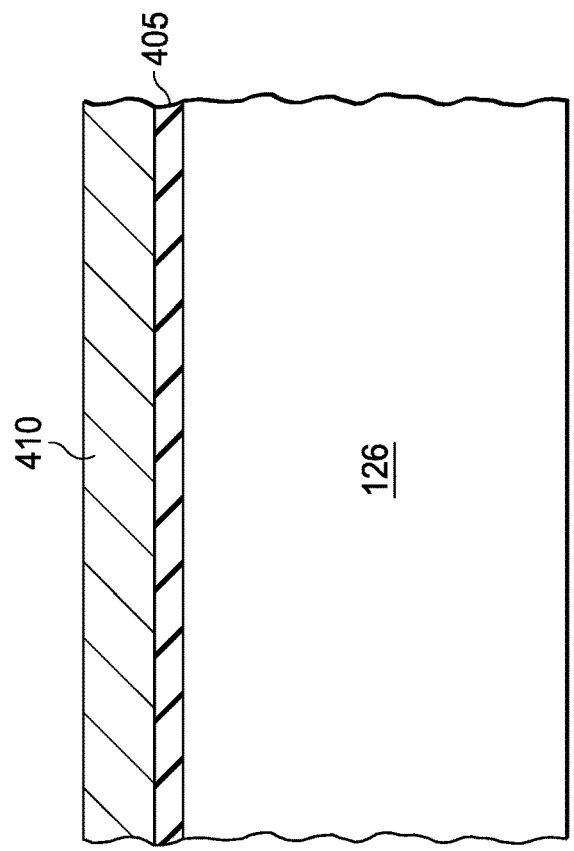
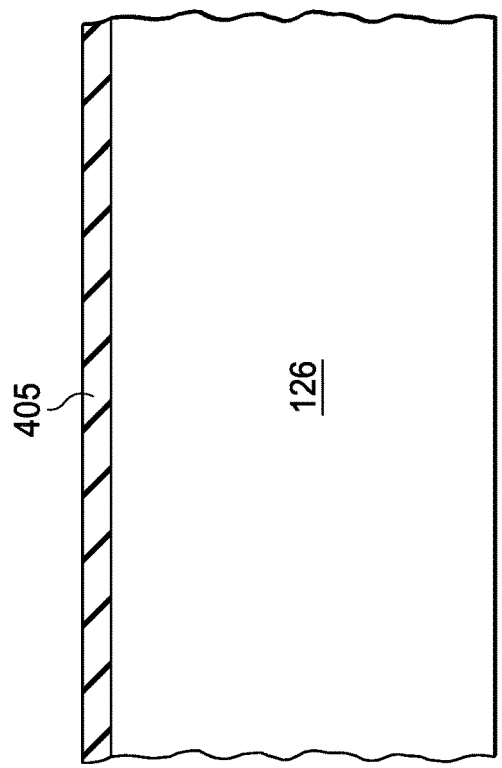
FIG. 3(b)
FIG. 3(a)

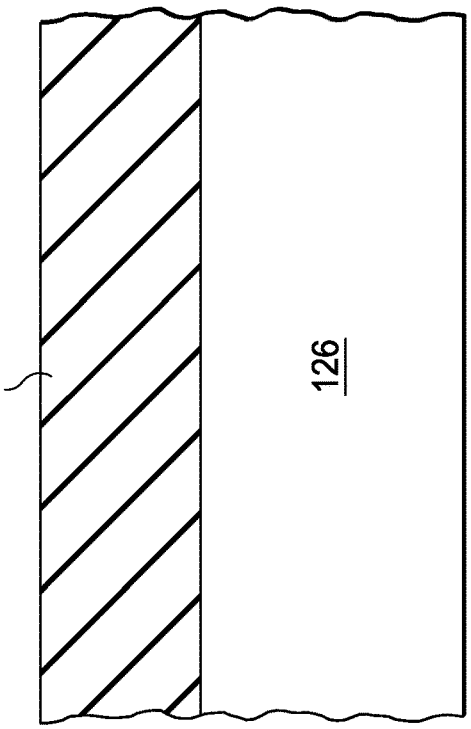
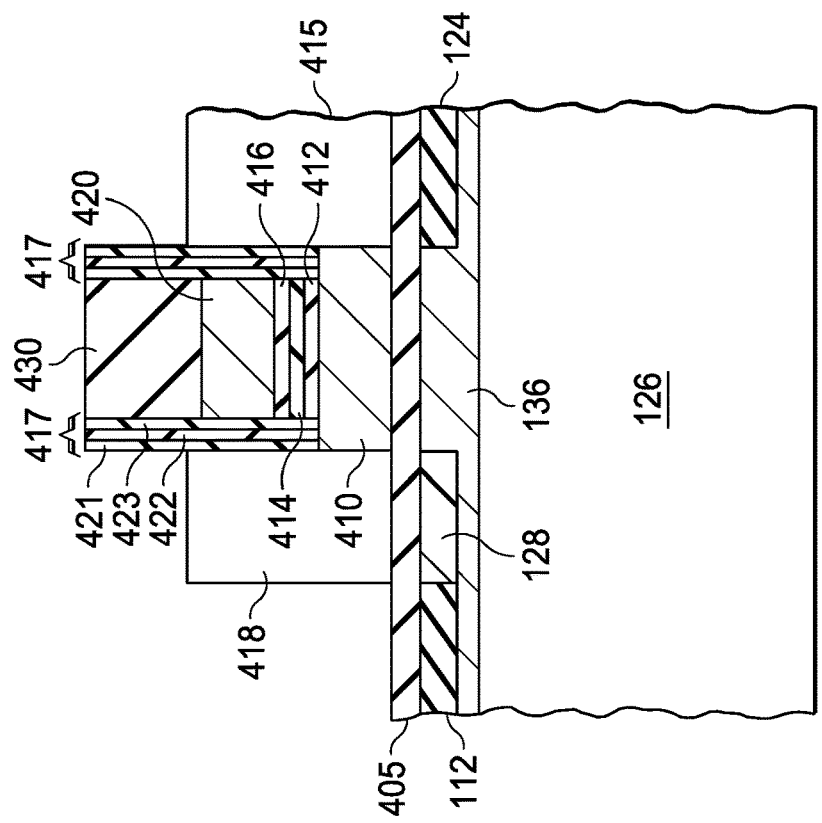
FIG. 4(a)
FIG. 3(g)

INTEGRATED CIRCUIT INCLUDING VERTICAL CAPACITORS

CROSS REFERENCE TO RELATED APPLICATIONS

This application is a divisional of U.S. patent application Ser. No. 15/977,712 filed May 11, 2018, which is incorporated herein by reference in its entirety.

BACKGROUND

A non-volatile-memory (NVM) bitcell is an electronic element that is configured to store information. The electrical state (e.g., threshold voltage) of a bitcell can be used to define a logic level, such as a logic low level (meaning digital low or 0) or a logic high level (meaning digital high or 1). This defined logic level may sometimes be referred to as information (or a bit) stored in the bitcell.

SUMMARY

In accordance with at least one example, an integrated circuit comprises a first plate, a second plate, and a dielectric layer disposed between the first and second plates, the first and second plates and the dielectric layer forming a vertical capacitor, wherein the first and second plates and the dielectric layer of the vertical capacitor are disposed on an isolation region of the integrated circuit.

In accordance with another example, an integrated circuit comprises a floating gate flash bitcell comprising at least a control gate layer, a word line gate layer, and a dielectric layer. The integrated circuit also comprises a vertical capacitor disposed on a shallow trench isolation (STI) region, the vertical capacitor comprising the control gate layer, the word line gate layer, and the dielectric layer, the dielectric layer positioned between the control gate layer and the word line gate layer.

In accordance with yet another example, a method of fabricating an integrated circuit having at least one vertical capacitor on a shallow trench isolation (STI) region on a substrate, comprises depositing a first dielectric layer on the STI region; depositing a first polysilicon layer on the first dielectric layer; patterning the first polysilicon layer to form a first plate of the vertical capacitor having a sidewall; depositing a second dielectric layer such that the second dielectric layer contacts the sidewall; and depositing a second polysilicon layer such that the second polysilicon layer contacts the second dielectric layer, the second polysilicon layer forms a second plate of the vertical capacitor.

BRIEF DESCRIPTION OF THE DRAWINGS

For a detailed description of various examples, reference will now be made to the accompanying drawings in which:

FIGS. 3(a)-3(g) depict the fabrication of an illustrative bitcell, in accordance with various examples.

FIGS. 4(a)-4(g) depict the fabrication of at least one vertical capacitor, in accordance with various examples.

DETAILED DESCRIPTION

Figure 1A:
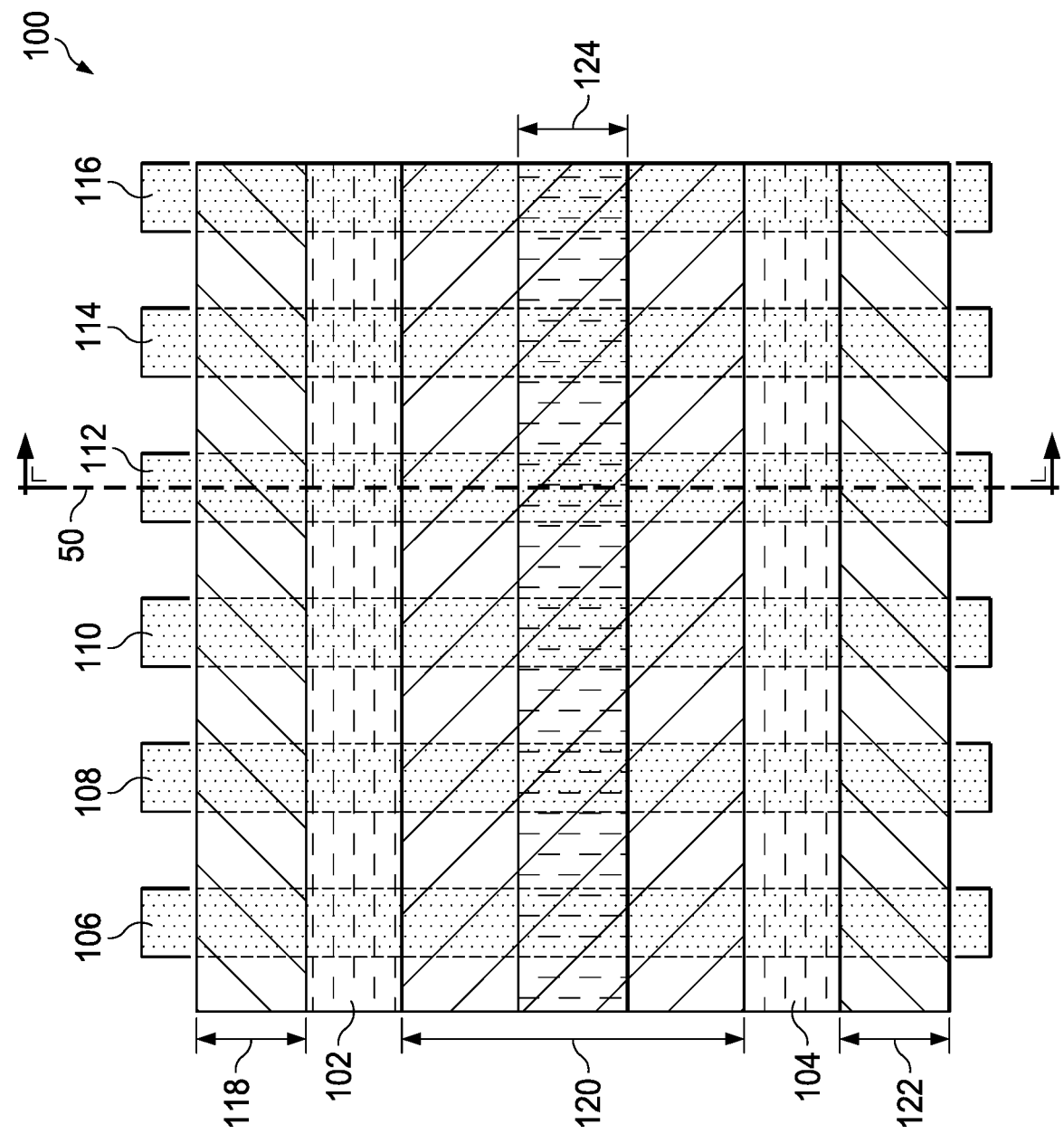
FIG. 1(a) depicts a portion of an illustrative layout of a floating gate flash bitcell memory array, in accordance with various examples.

Flash memory is a non-volatile storage medium that may store information in an array of bitcells. This stored information (or "bit") can be electrically erased, programmed, and read. In some cases, an array of floating-gate transistor bitcells may be used in flash memory. A floating-gate transistor bitcell resembles a standard metal-oxide-field-effect-transistor (MOSFET), except that the floating-gate transistor bitcell includes multiple gates, e.g., control gate and floating gate. As noted above, an electrical state of a bitcell can be used to define a logic level, which can be referred to as a bit stored in the bitcell. This may be performed using changes in threshold voltages of the bitcells. The threshold voltage of a floating-gate type transistor bitcell may change because of the presence or absence of trapped charge in its floating gate, which further alters the threshold voltage (relative to the old threshold voltage) of the floating-gate transistor bitcell. The threshold voltage (or the electrical state of the floating-gate transistor bitcell) when electrons are trapped in the floating-gate type transistor bitcell can be characterized to as a digital low or "0" stored as a bit in the bitcell. On the contrary, the electrical state when electrons are depleted in the floating gate can be referred to as digital high or "1" stored as a bit in the bitcell.

As described above, the characterization (e.g., digital high or low) of a bit stored in a floating-gate bitcell depends on the presence or absence of a charge in the floating gate. In some cases, a charge is stored/depleted in a floating gate by applying a voltage potential (e.g., greater than or equal to 10V) at the control gate of the floating-gate transistor bitcell. In some cases, a charge pump circuit is used to apply the voltage potential. A typical charge pump circuit boosts the input charge to provide voltages higher than the voltage supplied to it. In some cases, a charge pump circuit is capacitor-based, and typically, a capacitor-based charge pump circuit employs capacitors such as a metal-over-semiconductor (MOS).

A MOS capacitor typically includes a layer of metal (e.g., metal contact), a layer of insulating material (e.g., silicon dioxide), and a layer of semiconductor material (e.g., silicon). These layers are typically laterally fabricated, and the fabrication design of these capacitors results in a parasitic capacitance generated between the substrate (e.g. p-type silicon substrate) and the plates of the capacitors (e.g., nwell), which interferes with the capacitance of the MOS capacitor and degrades its performance. To avoid the parasitic capacitance interference, planar poly-to-poly capacitors or metal-to-poly capacitors are employed in the charge pumps. However, the fabrication of such capacitors requires extra masks, which increases the overall manufacturing cost. Therefore, an alternative design of capacitors that may be used in charge pump circuits and that mitigates the concerns mentioned above is desired.

Accordingly, at least some of the examples described in this disclosure are directed towards systems and methods for fabricating vertical capacitors that may be used in floating gate flash bitcell technology. In at least some examples, vertical capacitors disclosed herein are fabricated on the same die as the floating-gate flash bitcells, without using additional masks. The vertical capacitors described in this disclosure are positioned in isolation regions, such as the shallow trench isolation (STI) regions. The disposition of vertical capacitors on the STI regions prevents interference from the above-mentioned parasitic capacitance (e.g., nwell to p-substrate). In at least some examples, the vertical capacitors utilize the word line gate layers and the control gate layers of the flash bitcells as their capacitor plates. In at least some examples, the control gate layers and the word line gate layers are separated by a dielectric layer, which may comprise a multi-layer structure.

Referring now to FIG. 1(a), a portion of an illustrative layout 100 of a floating gate flash bitcell memory array (or floating gate bitcells) is shown in accordance with various examples. The layout 100 depicts at least some of the layers that form an array of floating gate bitcells. The layout 100 includes bit line (BL) layers 106, 108, 110, 112, 114, and 116, and a source line (SL) layer 124. The layout 100 also includes word line (WL) gate layers 118, 122, erase gate (EG) layer 120, and control gate (CG) layers 102, 104. The region occupied by the BL layers 106, 108, 110, 112, 114, and 116 is sometimes referred to as an active region. The layout 100 also depicts at least some of the layers that form the vertical capacitors to be utilized in the charge pump circuits (e.g., WL gate layers 118, 122, and CG layers 102, 104). This disclosure is not limited to a floating gate bitcell array including the aforementioned gate layers. The description of vertical capacitors below is valid for other types of floating gate bitcells, including floating gate bitcells that do not employ an erase gate layer.

FIG. 1(a) also illustrates a coordinate system 1, where the X-axis and the Y-axis of the coordinate system 1 each lie in the page of the drawing, and the Z-axis lies away from (outwards) the page of the drawing. For example, from a layout 100 perspective (as shown in FIG. 1(a)), one or more bitcells are positioned on line 50 aligned with the Y-axis; however, from a fabrication perspective (as shown in FIG. 1(b)), a side-view of the cross-section of one or more bitcells may be observed in the Y-Z plane along the line 50.

The layout 100, at least in part, is used as a layout (or blueprint) to fabricate an array of floating gate bitcells and an array of vertical capacitors that are implemented along with a CMOS logic array (not expressly depicted). In some examples, the layout 100 may be used to fabricate an array of bitcells that is implemented as a standalone memory device (e.g., implemented on its own semiconductor die, enclosed within its own chip package, etc.). In some examples, the layout 100 may be used to fabricate an array of bitcells that is implemented in an integrated circuit (IC) (e.g., implemented on a semiconductor die that includes additional circuit(s)).

Figure 1B:
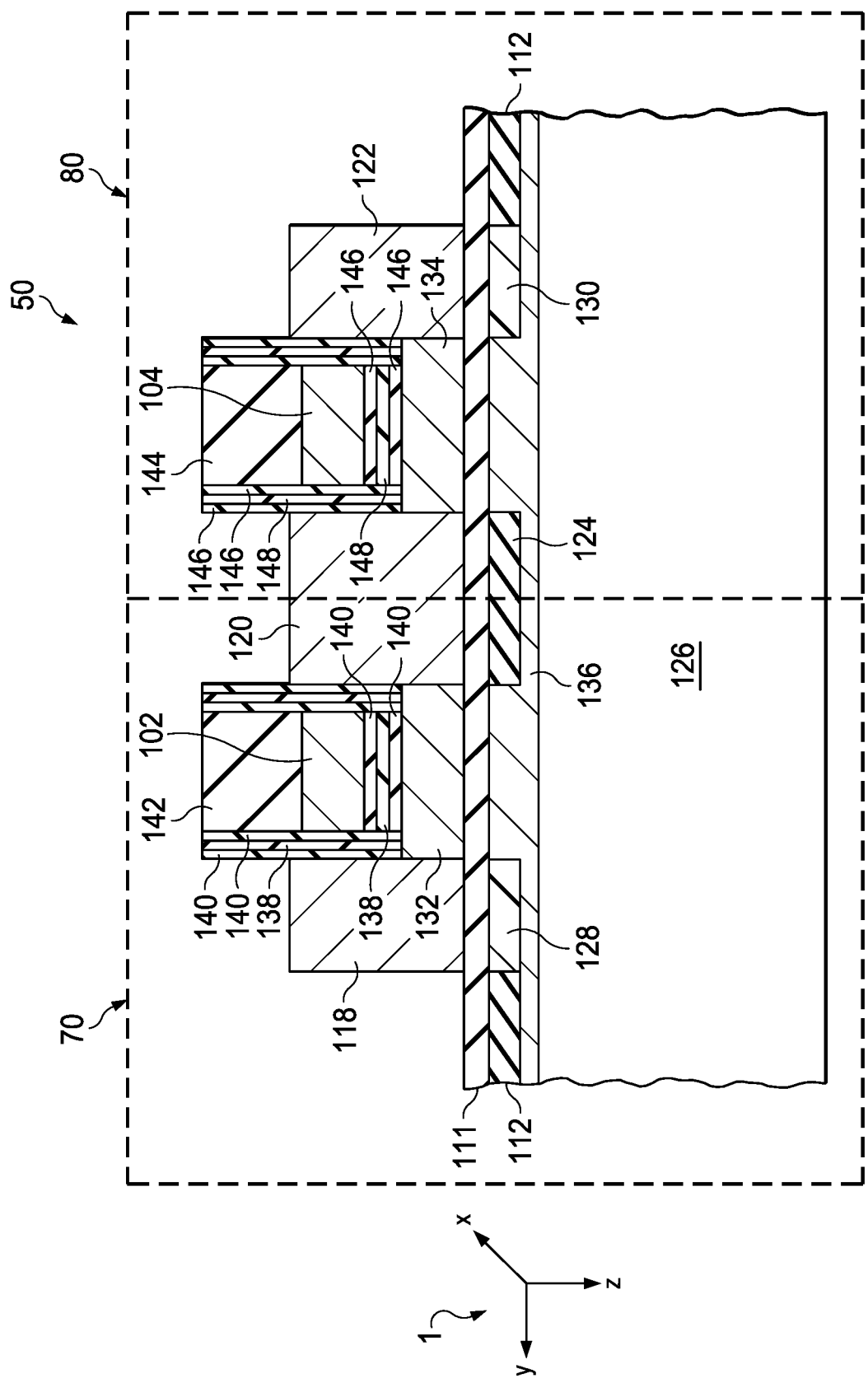
FIG. 1(b) depicts a side-view cross-section of a pair of illustrative bitcells, in accordance with various examples.

Referring now to FIG. 1(b), a side-view cross-section of a pair of illustrative bitcells 70, 80 may be observed in the Y-Z plane along the line 50 (FIG. 1(a)) through the bit line 112. Other bitcells may be observed in the Y-Z plane along other bit lines 106, 108, 110, 114, and 116 that are present on the Y-axis.

The bitcells 70 and 80 are substantially similar in structure. The bitcell 70 includes a bit line layer 112 that is disposed in a substrate 126. The bitcell 70 also includes the word line (WL) gate layer 118, the control gate layer 102, the floating gate layer 132, and the erase gate layer 120 (that is also shared by the bitcell 80). A dielectric layer 142 is located over the control gate layer 102. The bitcell 70 further includes dielectric layers 138, 140. These dielectric layers are fabricated to provide isolation between the word line gate layer 118, the control gate layer 102, the floating gate layer 132, and the erase gate 120. In some examples, the substrate 126 may include silicon. In such examples, the dielectric layer 140 may include silicon dioxide, and the dielectric layer 138 may include silicon nitride. The bitcell 70 also includes a dielectric layer 111 that acts as the floating gate dielectric and provides isolation between the floating gate 132 and the substrate 126. The bitcell 70 forms a WL transistor that includes the WL gate layer 118 (analogous to a gate of a MOSFET), the bit line layer 112 (analogous to a drain of a MOSFET), and the source line layer 124 (analogous to a source of a MOSFET). The bitcell 70 also includes an implant layer 128 that is disposed below the word line gate layer 118 in the substrate 126. In some examples, the implant layer 128 may be used to alter the threshold voltage of the WL transistor. In some examples, the substrate 126 also includes an additional implant layer, such as, the anti-punch through layer 136 that is formed by implanting dopants (e.g., boron) in the substrate 126. Although the bitcell 70 (or an array of such bitcells) depicted in FIG. 1(b) includes the erase gate layer 120, the control gate layer 102, the word line gate layer 118, and the floating gate layer 132, the description in this disclosure is not limited to a floating gate bitcell 70 including the aforementioned gate layers. This description is valid for a floating gate bitcell array, where each of the floating gate bitcells includes the word line gate layer 118, the control gate layer 102, and the floating gate layer 132.

Similar to the bitcell 70, the bitcell 80 includes the bit line 112, the source line layer 124, the erase gate layer 120, the floating gate layer 134, the control gate layer 104, and the word line gate layer 122. A dielectric layer 144 is located over the control gate layer 104, and an implant layer 130 is located under the word line gate layer 122. The bitcell 80 also includes dielectric layers 146, 148, which isolate the word line gate layer 122, the control gate layer 104, the floating gate layer 134, and the erase gate 120 from each other. The bitcell 80 also includes a dielectric layer 111 that acts as the floating gate 134 dielectric and provides isolation between the floating gate 132 and the substrate 126. In some examples, the substrate 126 may include silicon. In such examples, the dielectric layer 146 may include silicon dioxide, and the dielectric layer 148 may include silicon nitride. In some examples, the word line gate layers 118, 122, and the control gate layers 102, 104 comprise polysilicon.

In some examples, bitcells 70, 80 may be fabricated in an integrated circuit (IC) (e.g., implemented on a semiconductor die that includes additional circuit(s)).

As noted above, vertical capacitors form using the word line gate layers and control gate layers on the same die as the array of floating gate bitcells. Unlike the bitcells 70, 80 that are fabricated on the substrate 126, the vertical capacitors—to prevent parasitic capacitance interference—are fabricated on an isolation region (e.g., STI region). Although this disclosure generally describes vertical capacitors on a single STI region, in some examples, multiple vertical capacitors are distributed among multiple isolation regions (e.g., STI regions).

Figure 1C:
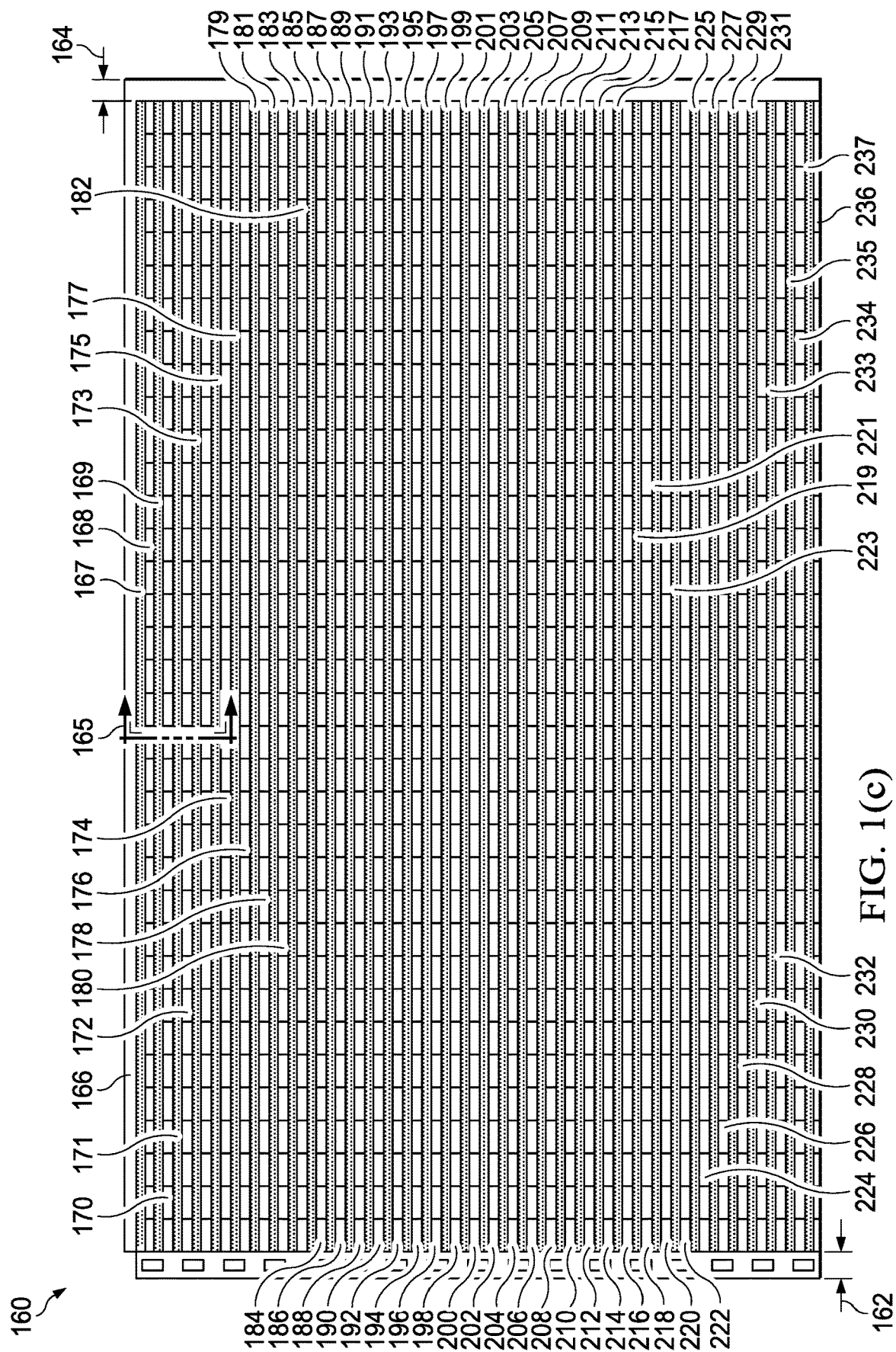
FIG. 1(c) depicts an illustrative layout of an array of vertical capacitors, in accordance with various examples.

FIG. 1(c) depicts an illustrative layout 160 of an array of vertical capacitors that are formed using the control gate layers 167, 169, 171, . . . , 237 and the word line gate layers 166, 168, 170, . . . , 236 of bitcells (not expressly shown) disposed in the same die as the vertical capacitors. The layout 160 includes the contact layer 162 that couples with each of the control gate layers 167, 169, 171, . . . , 237. The layout 160 also includes the contact layer 164 that couples with each of the word line gate layers 166, 168, 170, . . . , 236. In some examples, the word line gate layers 166, 168, 170, . . . , 236 and the control gate layers 167, 169, 171, . . . , 237 comprise polysilicon.

In some examples, the layout 160, along with the layout 100, may be used to fabricate an array of vertical capacitors and bitcells that are implemented in an integrated circuit (IC) (e.g., implemented on a semiconductor die that includes additional circuit(s)).

Figure 1D:
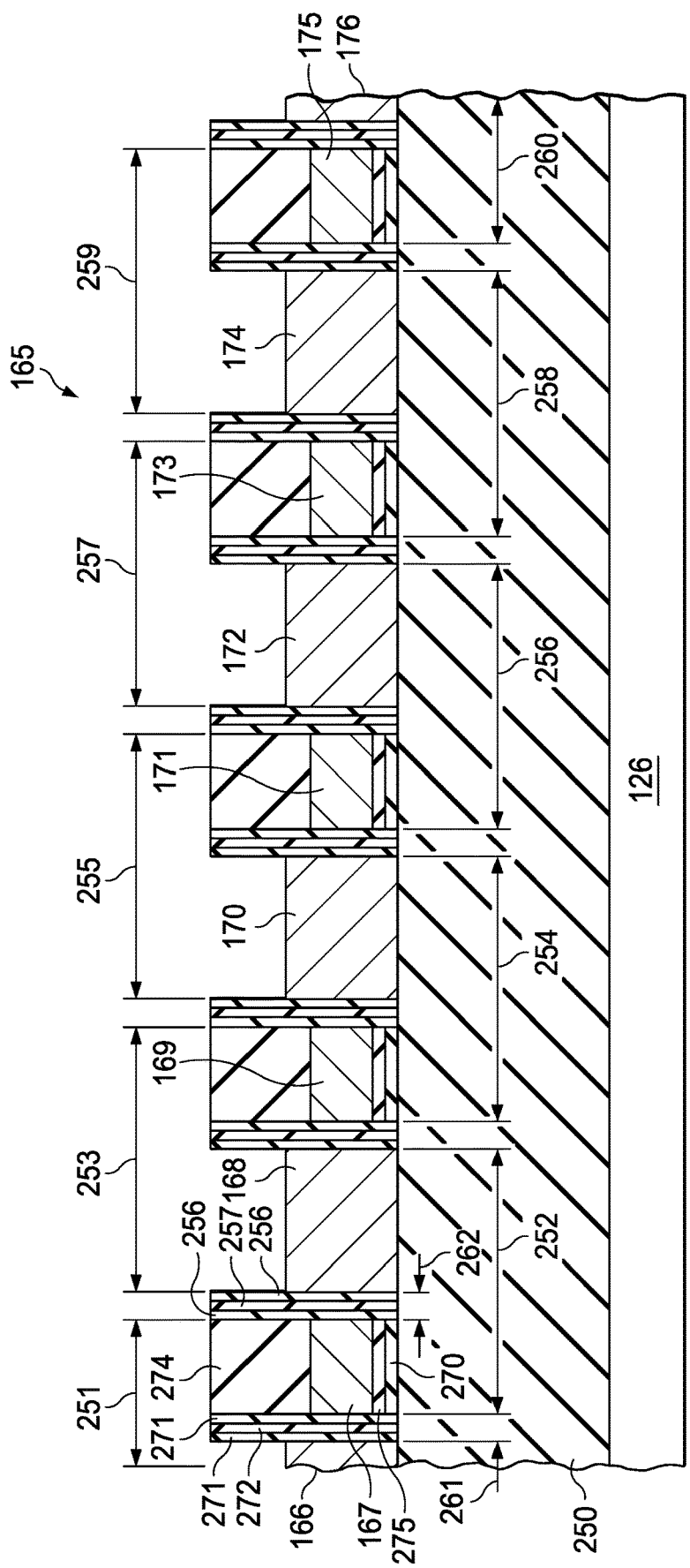
FIG. 1(d) depicts a side-view cross-section of illustrative vertical capacitors, in accordance with various examples.

Referring now to FIG. 1(d), a side-view cross-section of vertical capacitors disposed along a portion of line 165 (FIG. 1(c)) is depicted. FIG. 1(d) depicts vertical capacitors 251-260 that are disposed on the STI region 250, which is positioned on the substrate 126. The capacitors depicted in FIG. 1(d) comprise the word line gate layers 166, 168, 170, 172, 174, and 176 and the control gate layers 167, 169, 171, 173, and 175. For example, the word line gate layer 166 acts as one of the plates and the control gate layer 167 acts as the other plate of the vertical capacitor 251. In some examples, a dielectric layer 261 is disposed between the word line gate layer 166 and the control gate layer 167. In some examples, this dielectric layer 261 may comprise a tri-layer structure. In some examples, this tri-layer structure includes two dielectric layers 271 that are oxide layers and a dielectric layer 272 that is a nitride layer. In examples where the substrate comprises silicon, the dielectric layers 271 comprise silicon dioxide, and the dielectric layer 272 comprises silicon nitride. Other materials may also be used.

Similar to the vertical capacitor 251 formed between the word line gate 166 and the control gate 167, a vertical capacitor 252 forms between the control gate layer 167 and the word line gate layer 168, with the dielectric layer 262 disposed between them. Similar to the vertical capacitor 251, the vertical capacitor 252 is also disposed on the STI region 250. In some examples, the dielectric layer 262 comprises a tri-layer structure. In some examples, this tri-layer structure includes two dielectric layers 296 that are oxide layers and a dielectric layer 297 that is a nitride layer. In examples where the substrate comprises silicon, the dielectric layers 296 comprise silicon dioxide, and the dielectric layer 297 comprises silicon nitride. Similar to the vertical capacitors 251, 252, vertical capacitors 253-260 form between word line gate layers 168, 170, 172, 174, and 176 and the control gate layers 169, 171, 173, and 175 on the STI region 250, with each vertical capacitor 253-260 including a dielectric layer, which, in turn, may comprise a tri-layer structure.

Figure 2:
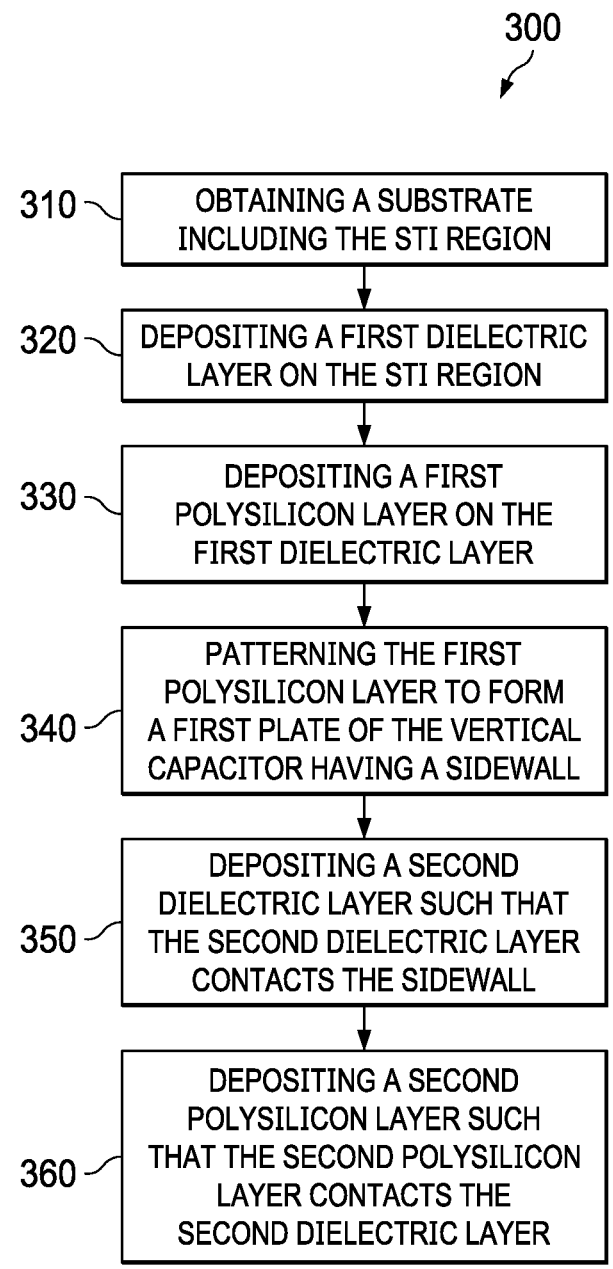
FIG. 2 depicts an illustrative method performed to fabricate vertical capacitors, in accordance with various examples.

Referring now to FIG. 2, an illustrative method 300 may be performed to fabricate the vertical capacitors that are positioned on the STI region. The method 300 is now described in tandem with the illustrative fabrication flow diagrams depicted in FIGS. 3(a)-3(g) and FIGS. 4(a)-4(g). FIGS. 3(a)-3(g) depict the fabrication of an illustrative bitcell including at least a control gate layer and a word line gate layer, and FIGS. 4(a)-4(g) depict the fabrication of at least one vertical capacitor that employs the control gate layer and the word line gate layer of the above-referenced bitcell to form its parallel plates.

The steps depicted in FIGS. 3(a)-3(g) may be observed along the line 50 (FIG. 1(a)), and the steps depicted in FIGS. 4(a)-4(g) may be observed along the line 165 (FIG. 1(c)).

For simplicity's sake, the fabrication steps depicted in FIGS. 3(a)-3(g) are of a single bitcell, and the steps depicted in FIGS. 4(a)-4(g) are of at least one vertical capacitor that is formed using the control gate layer and the word line gate layer of the bitcell. However, in other examples, the description may be adapted for the fabrication of a plurality of bitcells and vertical capacitors.

Figure 3D:
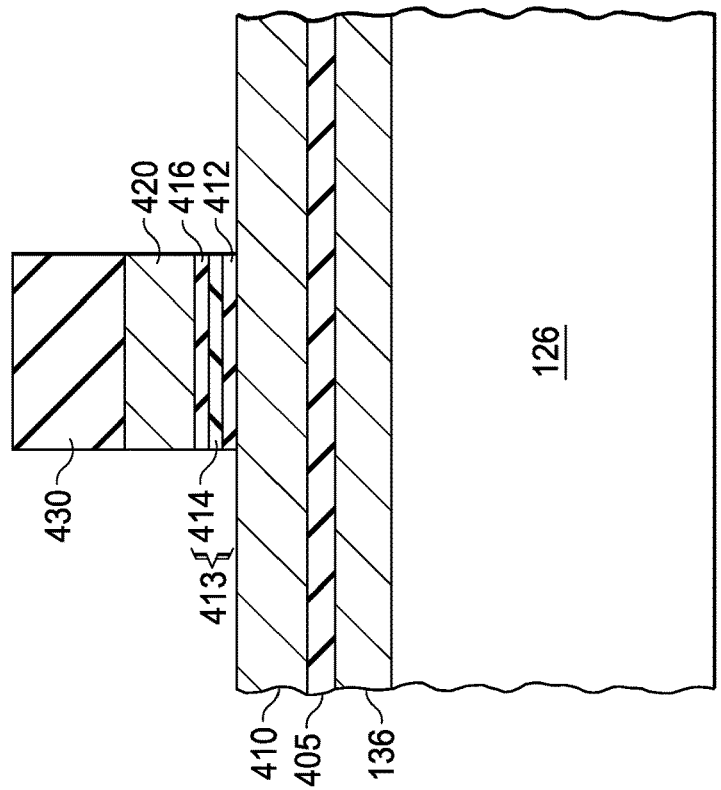
Figure 3C:
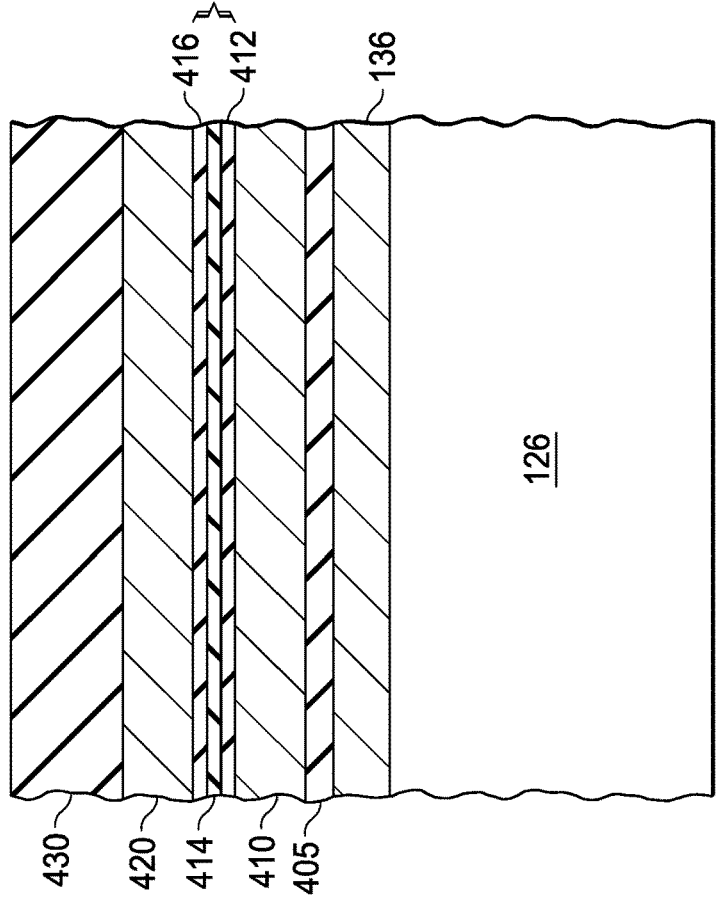
Figure 3F:
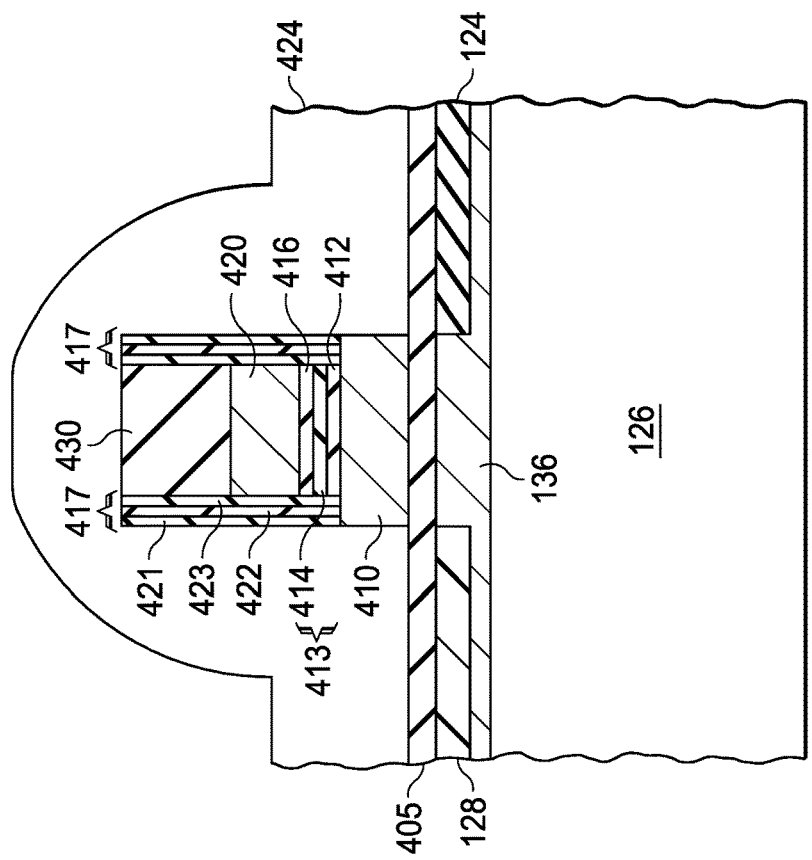
Figure 3E:
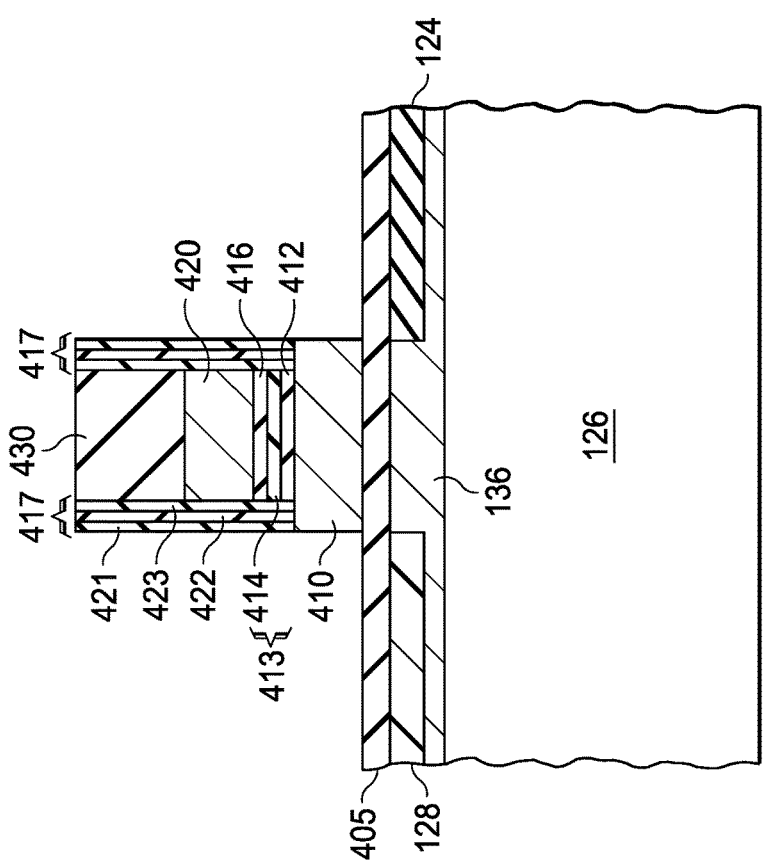
Figure 4C:
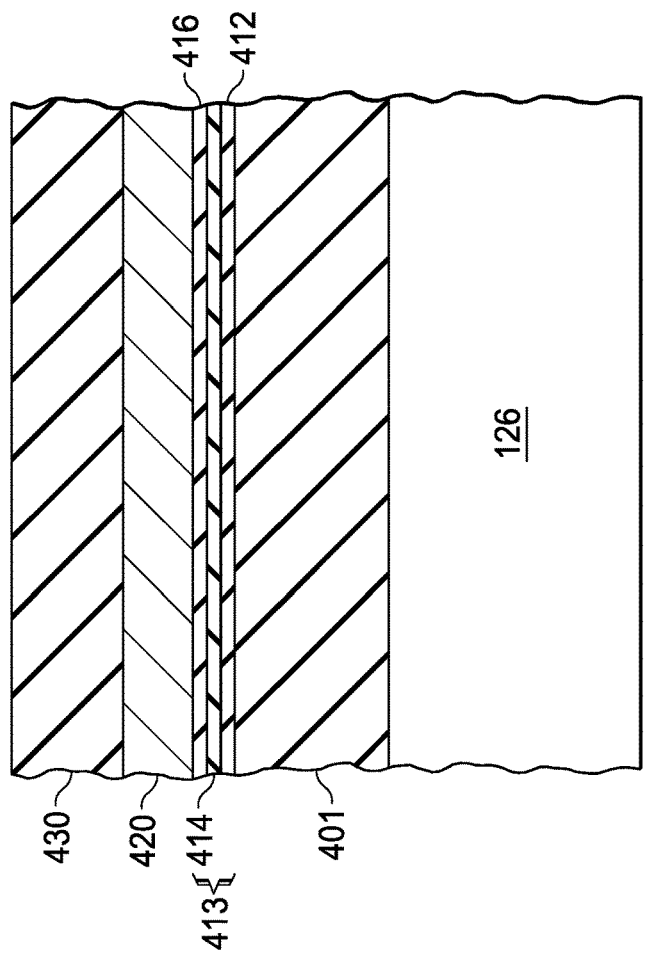
Figure 4B:
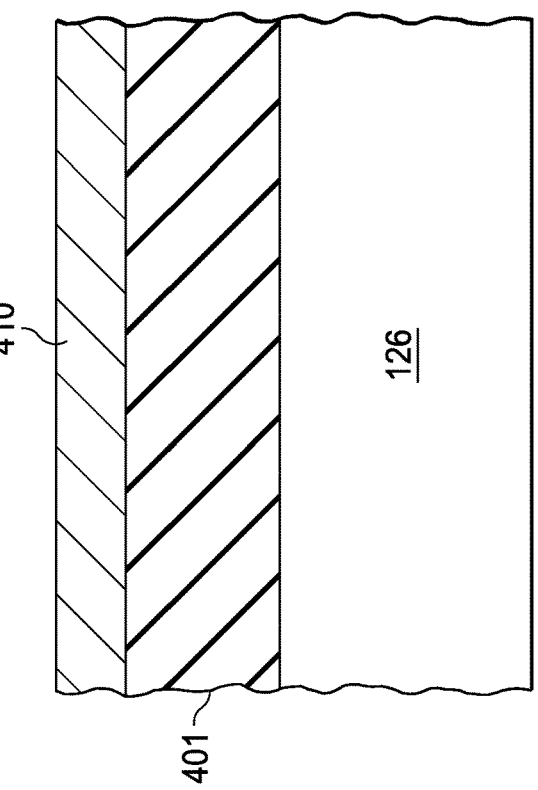

The method 300 begins with obtaining the substrate 126 that comprises STI regions (step 310), such as the STI region 401 (FIG. 4(a)), which comprises silicon dioxide. STI regions are created early during the semiconductor device fabrication process, before other electronic elements (e.g., transistors, bitcells) are formed. In some examples, the fabrication of STI regions involves etching a pattern of trenches (not expressly shown in FIGS. 3(a)-3(g) and 4(a)-4(g)) in the substrate, such as the substrate 126. Further steps in the fabrication of STI regions include depositing one or more dielectric materials (e.g., silicon dioxide) to fill the trenches, and then eliminating the excess dielectric material using planarization techniques (e.g., chemical-mechanical planarization).

In some examples, following the step 310, additional steps (not expressly included in the method 300) may be performed. The additional steps may include depositing a floating dielectric layer 405 and a floating gate layer 410 to form a portion of the bitcell (FIG. 3(a), FIG. 3(b), respectively). The deposition of the gate layer 410 can be observed in FIG. 4(b); however, the deposition of the dielectric layer 405 is masked to contain it to the fabrication of the bitcell. In some examples, the dielectric layer 405 may be fabricated such that the dielectric layer 405 is disposed on the STI region 410 (not expressly depicted in FIG. 4(b)). In some examples, the floating gate layer 410 comprises polysilicon. In some examples, the aforementioned deposition steps may be performed using chemical vapor deposition.

In some examples, from a vertical capacitor's perspective, the method 300 may also include removing the floating gate layer 410 from the STI region 401 (FIG. 4(c)). The floating gate layer 410 may be removed using masking techniques and the dry/wet etching technique such that the gate layer 410 is removed from the STI region 401 (FIG. 4(c)) and not from the dielectric layer 405 of FIG. 3(c). In some examples, the chemical-mechanical polishing technique may be used to remove the floating gate layer 410 from STI region 401.

Following the removal of the floating gate layer 410 from the STI region 401, the method 300 may proceed to step 320, which may include depositing the dielectric layer 413. From the vertical capacitor's perspective, the dielectric layer 413 is deposited on the STI region 401 (FIG. 4(c)), and from bitcell's perspective, the dielectric layer 413 is deposited on the floating gate layer 410 (FIG. 3(c)). In some examples, the dielectric layer 413 may comprise a tri-layer structure. In some examples, this tri-layer structure includes two dielectric layers 412, 416 that comprise silicon dioxide and a dielectric layer 414 that comprises silicon nitride. In some examples, the step 320 may also include implanting dopants (e.g., boron) in the substrate 126 to form an anti-punch through layer 136 (FIG. 3(c)).

The method 300 then moves to step 330, which includes depositing a control gate layer 420 on the dielectric layer 413. The control gate layer 420 can be observed from the perspective of both the vertical capacitor (FIG. 4(c)) and the bitcell (FIG. 3(c)). In some examples, the step 330 may also include depositing a dielectric layer 430 on the control gate layer 420. Again, the dielectric layer 430 can be observed from both the vertical capacitor's (FIG. 4(c)) and bitcell's (FIG. 3(c)) perspectives. In some examples, the deposition of both the control gate layer 420 and the dielectric layer 430 may be performed using chemical vapor deposition. In some examples, the control gate layer 420 includes polysilicon, and the dielectric layer 430 includes silicon nitride.

Figure 4E:
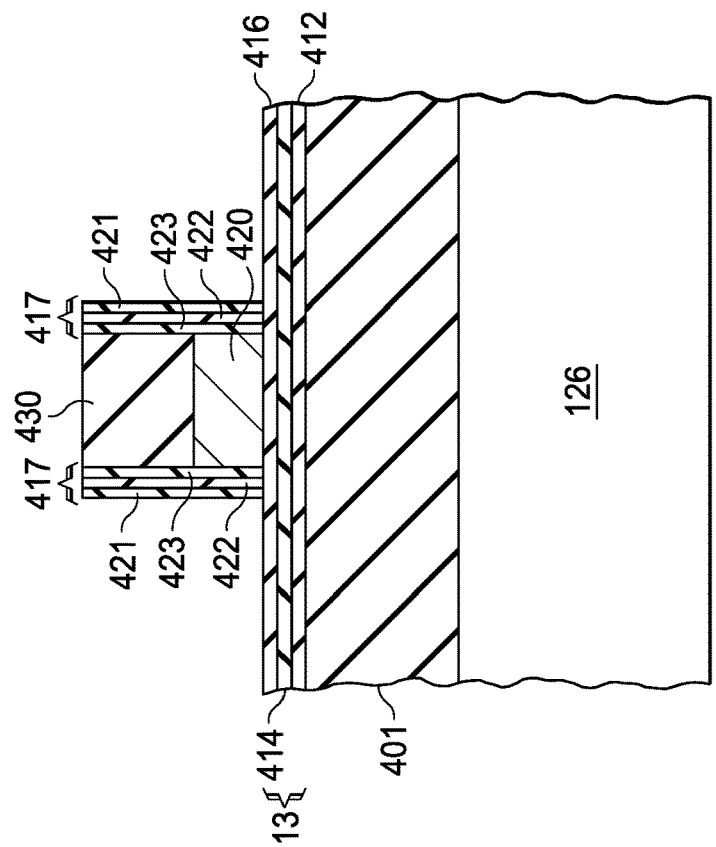
Figure 4D:
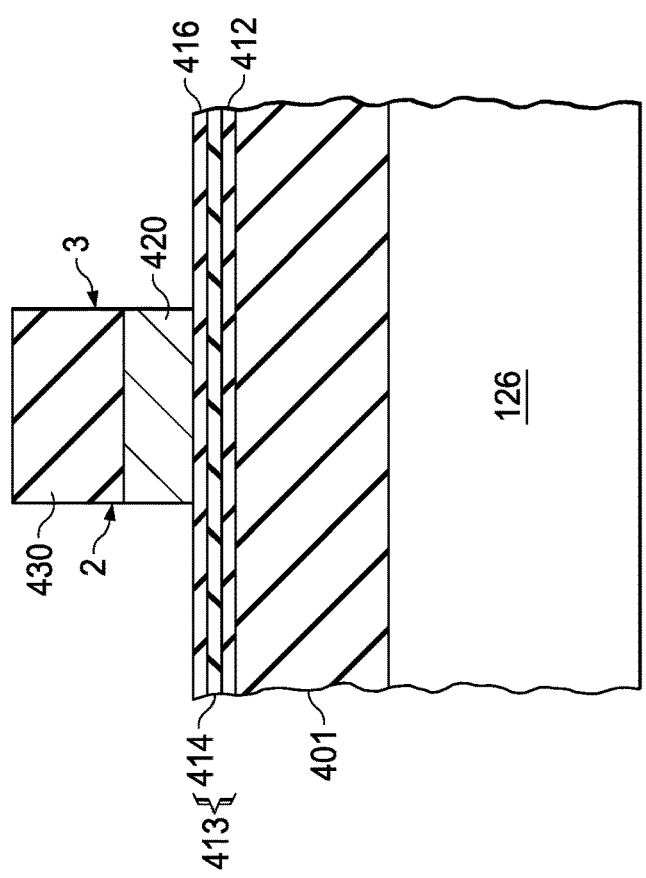
Figure 4G:
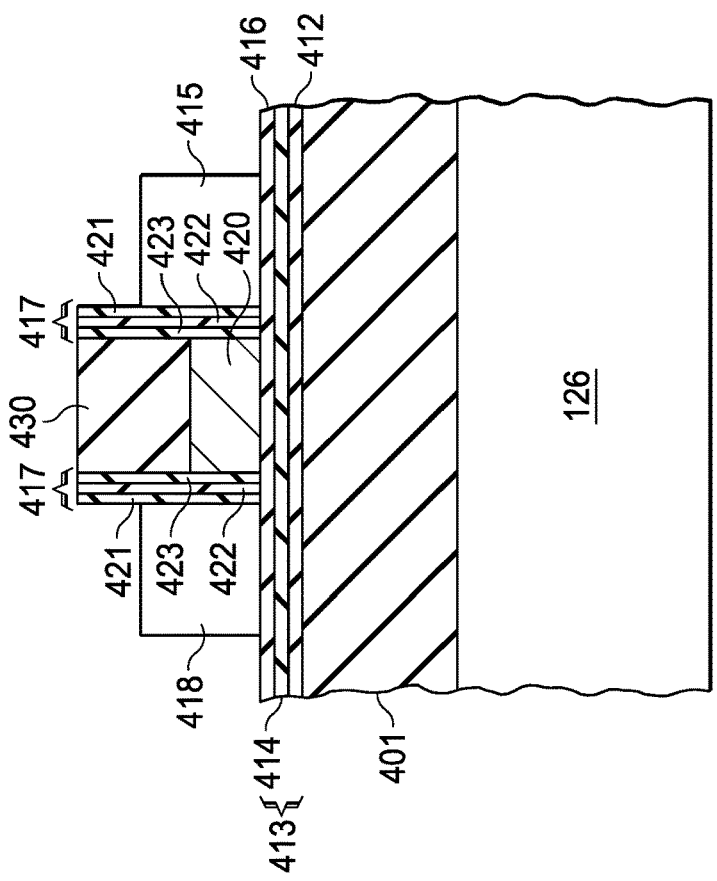
Figure 4F:
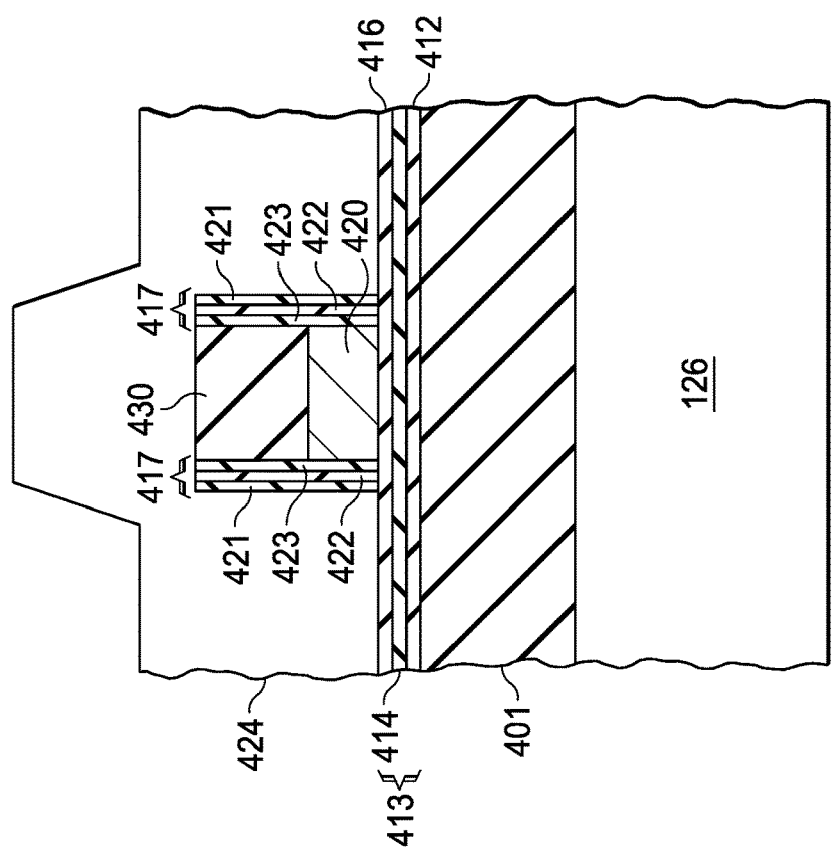

The method 300 may then move to the step 340 that includes patterning the control gate layer 420 (FIGS. 3(d) and 4(d)). The patterning may be performed using photo lithography and dry plasma etching. From the vertical capacitor's perspective, the control gate 420, or at least some portion of the control gate layer 420, following the step 340, forms a first plate of the vertical capacitor. As noted above, for simplicity's sake, the method 300, FIGS. 3(a)-3(g), and FIGS. 4(a)-4(g) describe the formation of a single bitcell and at least one vertical capacitor. In other examples, the patterning may be performed such that a plurality of bitcells and vertical capacitors may form. FIG. 4(d) shows the sidewalls 2, 3 of the patterned control gate layer 420.

The method 300 may proceed to step 350, which includes depositing dielectric layers 417 on the sidewalls 2, 3 of the control gate layer 420 (FIG. 4(e)). The deposition of dielectric layers 417 can also be observed in FIG. 3(e). Although FIG. 4(e) depicts the dielectric layers 417 abutting the control gate layer 420 and the dielectric layer 430 (e.g., the deposition of the dielectric layers 417 may extend from the top of the dielectric layer 416 to the top of the dielectric layer 430), in some examples, the dielectric layers 417 abut only the control gate layer 420. In some examples, following the deposition of the dielectric layers 417, a portion of the floating gate layer 410 may be etched/removed, which is further followed by implantation of dopants (such as boron) in the substrate 126. In some examples, the dielectric layers 417 assume a tri-layer structure, which includes the dielectric layers 421, 422, 423. In some examples, the dielectric layers 421, 423 comprise silicon dioxide, and the dielectric layer 422 comprises silicon nitride.

The method 300 may then proceed to step 360, which includes depositing a polysilicon layer 424 such that the polysilicon layer 424 is disposed on top of the dielectric layer 416, the dielectric layers 421, 422, 423, and the dielectric layer 430 (FIGS. 3(f), 3(g), 4(f), and 4(g)). The step 360 may also include etching a portion of the polysilicon layer 424 to form two separate polysilicon layers 415 and 418 (FIGS. 3(g) and 4(g)), which are referred to as word line gate layer and erase gate layer, respectively.

In the foregoing discussion and in the claims, the terms "including" and "comprising" are used in an open-ended fashion, and thus should be interpreted to mean "including, but not limited to . . . ." The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first plate;
   a second plate; and
   a dielectric layer disposed between the first and second plates, the first and second plates and the dielectric layer forming a vertical capacitor,
   wherein the first and second plates and the dielectric layer of the vertical capacitor are disposed on an isolation region of the integrated circuit.

2. The integrated circuit of claim 1 further comprising a second vertical capacitor, comprising:
   the second plate;
   a third plate; and
   a second dielectric layer disposed between the second and third plates on the isolation region.

3. The integrated circuit of claim 1, wherein the integrated circuit further comprises a flash bitcell that includes at least the first plate and the second plate.

4. The integrated circuit of claim 1, wherein the dielectric layer includes a first silicon dioxide layer, a second silicon dioxide layer, and a silicon nitride layer.

5. The integrated circuit of claim 1, wherein the isolation region is disposed on a silicon substrate.

6. The integrated circuit of claim 1, wherein the isolation region includes shallow trench isolation (STI) region.

7. The integrated circuit of claim 1, wherein the isolation region includes silicon dioxide.

8. An integrated circuit, comprising:
   a floating gate flash bitcell comprising at least a control gate layer, a word line gate layer, and a dielectric layer; and
   a vertical capacitor disposed on a shallow trench isolation (STI) region, the vertical capacitor comprising the control gate layer, the word line gate layer, and the dielectric layer, the dielectric layer positioned between the control gate layer and the word line gate layer.

9. The integrated circuit of claim 8, wherein the control gate layer and the word line gate layer include polysilicon.

10. The integrated circuit of claim 8, wherein the STI region includes silicon dioxide.

11. The integrated circuit of claim 8, wherein the STI region is disposed on a silicon substrate.

12. The integrated circuit of claim 8 further comprising a floating gate layer, the dielectric layer positioned between the control gate layer and the floating gate layer.

13. The integrated circuit of claim 8, wherein the dielectric layer comprises at least one silicon dioxide layer.

14. The integrated circuit of claim 8, wherein the dielectric layer comprises a first silicon dioxide layer, a second silicon dioxide layer, and a silicon nitride layer.

15. An integrated circuit, comprising:
   a first dielectric layer over a semiconductor substrate;
   a first conductive line located on the first dielectric layer and a second dielectric layer located over the first conductive line, the first conductive line and the second dielectric layer each having a corresponding first sidewall;
   a third dielectric layer on the first sidewalls of the first conductive line and the second dielectric layer; and
   a second conductive line located over the first dielectric layer and contacting the third dielectric layer.

16. The integrated circuit of claim 15, wherein the first dielectric layer comprises a first silicon dioxide layer, a second silicon dioxide layer, and a silicon nitride layer between the first and second silicon dioxide layers.

17. The integrated circuit of claim 15, wherein the third dielectric layer comprises a first silicon dioxide layer, a second silicon dioxide layer, and a silicon nitride layer between the first and second silicon dioxide layers.

18. The integrated circuit of claim 15, wherein the first dielectric layer is located over a shallow trench isolation region that includes silicon dioxide.

19. The integrated circuit of claim 15, wherein the first conductive line and the second dialectic layer each have a second sidewall opposite the respective first sidewalls, and further comprising:
   a fourth dielectric layer on the second sidewalls and third conductive line; and
   a second conductive line located over the first dielectric layer and contacting the fourth dielectric layer.

20. The integrated circuit of claim 15, wherein the second dielectric layer comprises SiN.

21. The integrated circuit of claim 15, wherein the first dielectric layer comprises a first silicon dioxide layer, a second silicon dioxide layer, and a silicon nitride layer between the first and second silicon dioxide layers.

* * * * *